United States Patent
Yang et al.

(10) Patent No.: US 11,947,379 B2
(45) Date of Patent: Apr. 2, 2024

(54) HOST INTERFACE TO MODULATE A PHASE OF A CLOCK AND SYSTEM-ON-CHIP INCLUDING SAME

(71) Applicant: SAMSUNG ELECTRONICS CO., LTD., Suwon-si (KR)

(72) Inventors: Jihyun Yang, Hwaseong-si (KR); Namtaek Hyung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 64 days.

(21) Appl. No.: 17/580,861

(22) Filed: Jan. 21, 2022

(65) Prior Publication Data

US 2022/0283603 A1 Sep. 8, 2022

(30) Foreign Application Priority Data

Mar. 5, 2021 (KR) .................. 10-2021-0029543

(51) Int. Cl.
| | |
|---|---|
| *G06F 1/08* | (2006.01) |
| *G06F 13/36* | (2006.01) |
| *H03H 11/16* | (2006.01) |
| *H03K 19/20* | (2006.01) |

(52) U.S. Cl.
CPC .............. *G06F 1/08* (2013.01); *G06F 13/36* (2013.01); *H03H 11/16* (2013.01); *H03K 19/20* (2013.01)

(58) Field of Classification Search
CPC . G06F 1/08; G06F 13/38; G06F 13/36; G06F 13/385; G06F 13/384; G06F 13/1689; G06F 13/4217
See application file for complete search history.

(56) References Cited

U.S. PATENT DOCUMENTS

| | | | |
|---|---|---|---|
| 5,070,492 A * | 12/1991 | Ogawa ................ | G11B 7/00745 |
| 7,349,498 B2 | 3/2008 | Cranford, Jr. et al. | |
| 8,121,237 B2 | 2/2012 | Stott et al. | |
| 8,582,391 B2 | 11/2013 | Chiu | |
| 9,780,795 B2 | 10/2017 | Navid | |
| 10,447,465 B2 | 10/2019 | Stott et al. | |
| 10,650,871 B2 | 5/2020 | Chae et al. | |
| 2012/0049919 A1* | 3/2012 | Fujii ....................... | H04L 7/033 |
| | | | 327/241 |
| 2012/0230679 A1* | 9/2012 | Hayashi ............. | H04B 10/5051 |
| | | | 398/28 |
| 2017/0048057 A1* | 2/2017 | Kim ........................ | H04W 4/80 |
| 2018/0241381 A1* | 8/2018 | Yi ........................... | H03K 5/159 |
| 2020/0273507 A1* | 8/2020 | Chae ....................... | G11C 7/222 |

FOREIGN PATENT DOCUMENTS

KR  1020190085264 A  7/2019

* cited by examiner

*Primary Examiner* — Raymond N Phan
(74) *Attorney, Agent, or Firm* — Fish & Richardson P.C.

(57) ABSTRACT

A host interface includes; a phase shift detector, a phases shifter, and control logic controlling operation of the phase shift detector and the phase shifter. The host interface sends a command and a clock to a device, receives a response from the device, communicates data to the device synchronously with the clock, and samples data received from the device synchronously with a modulated clock. The phase shift detector provides a shift value based on the response, and the phase shifter modulates a phase of the clock based on the shift value to generate the modulated clock.

20 Claims, 10 Drawing Sheets

HOST INTERFACE TO MODULATE A PHASE OF A CLOCK AND SYSTEM-ON-CHIP INCLUDING SAME

CROSS-REFERENCE TO RELATED APPLICATIONS

This application claims priority under 35 U.S.C. § 119 to Korean Patent Application No. 10-2021-0029543 filed on Mar. 5, 2021 in the Korean Intellectual Property Office, the subject matter of which is hereby incorporated by reference.

BACKGROUND

Embodiments of the inventive concept relate generally to host interfaces and System-on-Chip(s) (SoCs) including same. More particularly, embodiments of the inventive concept relates to a host interface modulating a clock phase based on a response (e.g., a feedback clock) received from an storage device, as well as SoCs including same.

A storage device may receive a clock signal from a host. The storage device may then perform various operation(s) requested by the host based on the received clock. For example, in response to a read command received from the host, the storage device may communicate (or return) a response signal and read data to the host, and in response to that the response signal received from the storage device, the host may sample (or otherwise process) the read data received from the storage device.

However, where the storage device operates in relation to a first operating voltage and the host operates in relation to a second operating voltage different from the first operating voltage, the host and/or the storage device may require one or more level shifters in order to communicate with one another. In this regard, a level shifter is a circuit appropriately regulating the level (or voltage) of various signals communicated (e.g., sent and/or received) between the host and the storage device. Unfortunately, the presence of the one or more level shifters in the host and/or the storage device tends to delay or skew the communication of various signals (e.g., the response signal and the data signals) between the storage device and the host. Such signal delay or signal skewing may cause a failure in data communication between the host and the storage device.

SUMMARY

Embodiments of the inventive concept provide a host interface including a phase shifter modulating a clock phase based on a response received from a device or a feedback clock provided from a level shifter, as well as a system-on-chip including same.

According to some embodiments, a host interface is included in a host communicating data with a device. The host interface includes; a phase shift detector, a phases shifter, and control logic configured to control operation of the phase shift detector and the phase shifter. The host interface sends a command and a clock to the device, receives a response from the device, communicates data to the device synchronously with the clock, and samples data received from the device synchronously with a modulated clock, the phase shift detector is configured to provide a shift value based on the response, and the phase shifter is configured to modulate a phase of the clock based on the shift value to generate the modulated clock.

According to some embodiments, in a system including a host communicating data with a device through a level shifter, a host interface includes; a phase shift detector, a phases shifter, and control logic configured to control operation of the phase shift detector and the phase shifter. The host interface sends a command and a clock to the device through the level shifter, receives a response from the device through the level shifter, and receives a feedback clock from the level shifter, the phase shift detector is configured to select one of the response and the feedback clock as a selected value in response to an input selection signal, and provide a shift value based on the selected value, the phase shifter is configured to modulate a phase of the clock based on the shift value to generate a modulated clock, data sent from the host interface to the device through the level shifter is sent synchronously with the clock, and data received in the host interface from the device through the level shifter is sampled using the modulated clock.

According to some embodiments, a system-on-chip includes; a processor, and a host including a host interface with a clock modulator, wherein the host interface is configured to send a command and a clock to a device through a level shifter and receive a response to the command from the device through the level shifter under control of the processor. The clock modulator is configured to select one of the response and a feedback clock received from a level shifter as a selected value, and modulate a phase of the clock based on the selected value to generate a modulated clock, data sent from the host to the device through the level shifter is sent synchronously with the clock, and data received in the host from the device through the level shifter is sampled synchronously with the modulation clock.

BRIEF DESCRIPTION OF THE DRAWINGS

The making and use of the inventive concept may be better understood upon consideration of the following detailed description together with the accompanying drawings, in which.

DETAILED DESCRIPTION

Throughout the written description and drawings, like reference numbers and labels are used to denote like or similar elements, components and/or features.

Figure 1:
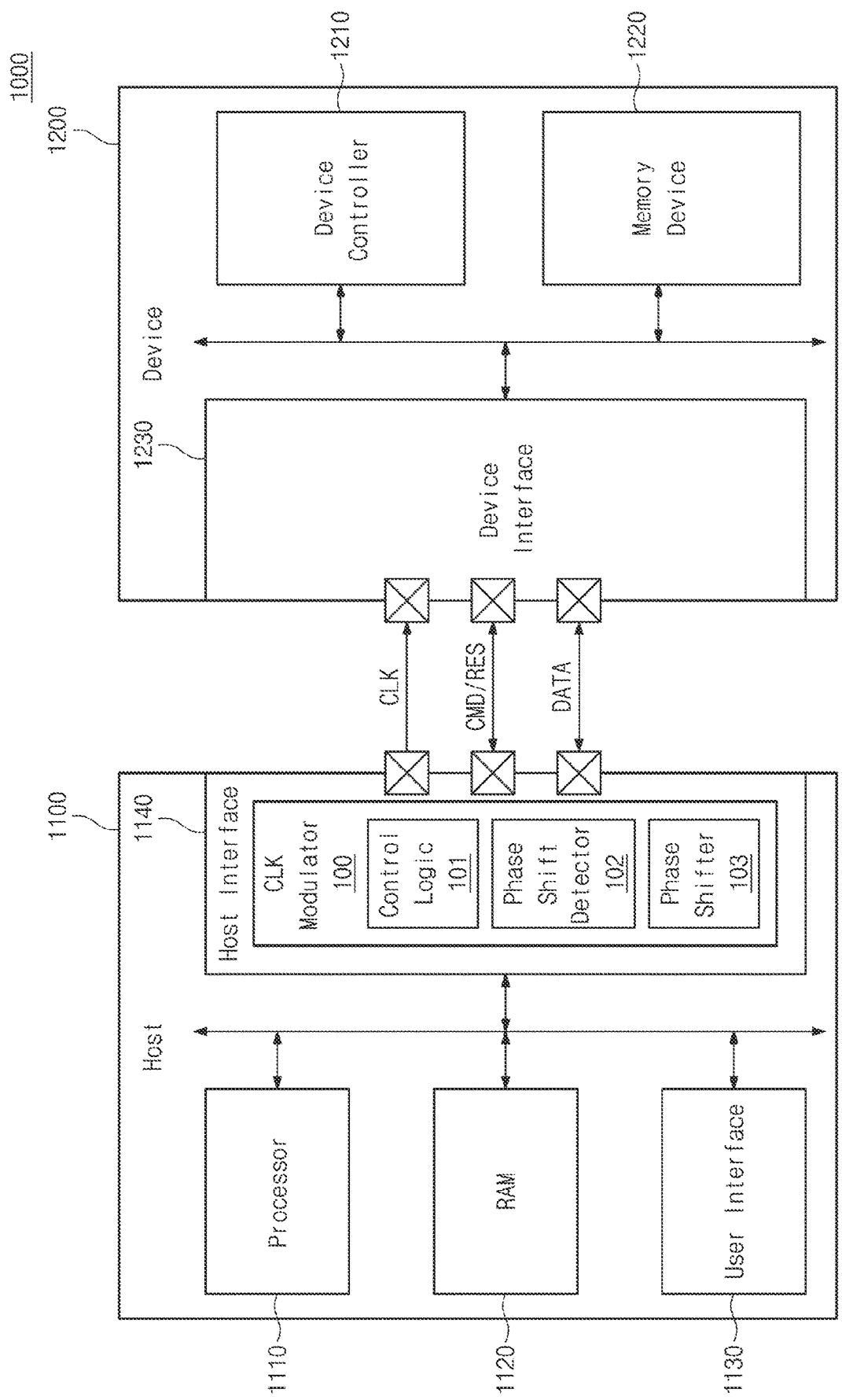
FIG. 1 is a block diagram illustrating a memory system according to embodiments of the inventive concept.

FIG. 1 is a block diagram illustrating a memory system 1000 according to embodiments of the inventive concept. Referring to FIG. 1, the memory system 1000 generally includes a host 1100 and a device 1200. In some embodiments, the device 1200 may include a storage device, a modem, or any device which may operate in response to a clock signal sent from the host 1100.

Here, the host 1100 may include a processor 1110, a random access memory (RAM) 1120, a user interface 1130, and a host interface 1140. The components of the host 1100 may communicate with each other through one or more internal bus(es).

The processor 1110 may control overall operation of the host 1100. The processor 1110 may perform various operation(s) using software, firmware and/or programming code loaded to the RAM 1120. In some embodiments, the processor 1110 may function as a Central Processing Unit (CPU) for the host 1100, and may include one or more processor cores.

In some embodiments, the processor 1110 may generate a clock CLK that may be used during operations performed by the host 1100 and/or during operations performed by the device 1200. Here, the clock CLK may be provided to various components of the host 1100 through the internal bus(es). That is, one or more of the processor 1110, the RAM 1120, the user interface 1130, and the host interface 1140 may operate based on (e.g., in response to) the clock CLK.

The RAM 1120 may be used to store data processed or to-be-processed by the processor 1110, as well as various programming code. In this regard, the RAM 1120 may function as a main memory device for the host 1100. The RAM 1120 may implemented using one or more of a dynamic random access memory (DRAM), a static random access memory (SRAM), a phase-change random access memory (PRAM), a magnetic random access memory (MRAM), a ferroelectric random access memory (FeRAM), a resistive random access memory (RRAM), etc. In some embodiments, the RAM 1120 may be referred to as a "buffer memory" or a "cache memory".

Alternately, in some embodiments, the host 1100 may include two or more physically separate and/or logically separate RAMs 1120, or the RAM 1120 may be implemented as an external memory device capable of communicating with the host 1100.

The user interface 1130 may be used to facilitate various modes of communicate with a user of the host 1100. For example, the user interface 1130 may provide the user with data generated by the processor 1110. In some embodiments, the user interface 1130 may include at least one of various input devices such as a keyboard, a touch pad, a mouse, and a microphone. The user interface 1130 may further include at least one of various output devices such as a monitor and a printer.

The host interface 1140 may be used to facilitate communicate with one or more device(s) external to the host 1100. In this regard, the host 1100 may communicate (e.g., wirelessly and/or in a hardwired configuration) with the device 1200 through the host interface 1140 using one or more communication protocols.

Thus, in the illustrated embodiment of FIG. 1, the host interface 1140 may send the clock CLK to the device 1200 according to a competent data communication protocol. For example, the host interface 1140 may issue a command CMD controlling operation of the device 1200. Alternately or additionally, the host interface 1140 may send data "DATA" to-be-stored (hereafter, regardless of sending protocol, "write data") to the device 1200.

Thereafter, the host interface 1140 may receive a response RES corresponding (or returned in relation) to the command CMD and the write data stored in the device 1200 from the device 1200. In some embodiments, the command CMD and the response RES may be transferred via the same pin(s) and/or bus(es).

In some embodiments, the host interface 1140 may include a clock modulator 100, wherein the clock modulator 100 may modulate the clock CLK based on the response RES received from the device 1200. Thereafter, the resulting modulated clock may be used to process the data "DATA" retrieved by the host 1100 from the device 1200 (hereafter, regardless of protocol, "read data"). In the illustrated example of FIG. 1, the clock modulator 100 may include at least control logic 101, a phase shift detector 102, and a phase shifter 103.

The control logic 101 may be used to generate various signals controlling the operation of the phase shift detector 102 and phase shifter 103. That is, under control of the control logic 101, the phase shift detector 102 may determine an amount by which a phase of the clock CLK will be shifted based on the response RES received from the device 1200. That is, the phase shifter 103 may modulate the phase of the clock CLK using a value corresponding to a phase-shift amount determined by the phase shift detector 102.

In some embodiments, the clock modulator 100 may determine a time (e.g., generate a "counted value" using a counting operation) between a first time (e.g., a time at which (or after which) the command CMD was sent from the host 1100 to the device 1200) and a second time (e.g., a time at which the response RES was received by the host 1110 from the device 1200). Thereafter, the clock modulator 100 may delay a phase of the clock CLK based on the counted value. For example, the phase shift detector 102 may start a counting operation at the first time and end the counting operation at the second time in order to provide the counted value to the phase shifter 103. In this manner, the phase shifter 103 may delay a phase of the clock CLK, based on the counted value provided by the phase shift detector 102.

As noted above, the host interface 1140 may process read data received from the device 1200 using a modulated clock provided by the phase shifter 103. However, as the host interface 1140 uses the modulated clock instead of the clock CLK to communicate read data from the device 1200 to the host 1100, the host interface 1140 may process the read data more accurately and efficiently. However, under some conditions wherein the host interface 1140 uses the modulated clock to control the communication of read data, a valid window for the read data, as received from the device 1200 and a toggle timing of a clock may not be well aligned with each other. Nonetheless, it is possible in embodiments of the inventive concept to prevent a failure in read data sampling. That is, the potential for loss of otherwise valid read data may be reduced.

In this regard, an exemplary operation of the clock modulator 100 will be described hereafter in some additional detail.

Referring to FIG. 1, the device 1200 may include a device controller 1210, a memory device 1220, and a device interface 1230. The components of the device 1200 may communicate with each other via one or more internal bus(es). In some embodiments, the device 1200 may be implemented as one or more various devices capable of receiving the command CMD and the clock CLK (or a signal similar to the clock CLK) from the host 1100.

Hereafter, a signal similar (or analogous) to the clock CLK will be referred to as the "similar clock." Here, the similar clock may include an enable period and a disable period, wherein the similar signal has a waveform similar to that of the clock CLK during the enable period, but has a specific fixed value during the disable period.

In some embodiments, For example, the device 1200 may be implemented with a device, which communicates with the host 1100 through a synchronous interface, such as an SD card.

The device controller 1210 may be used to control operation of the memory device 1220 and the device interface 1230 based on the command CMD received from the host 1100. That is, the device controller 1210 may generate various control signals that control operation of the memory device 1220 and the device interface 1230. For example, the device controller 1210 may generate control signals causing the execution of various data access operations, such as a read operation and a write operation by the memory device 1220. The device controller 1210 may also be used to generate various control signals communicated to the host 1100.

The memory device 1220 may store the write data received from the host 1100 under control of the device controller 1210. In response to a request from the host 1100, the memory device 1220 may read data stored in the memory device 1220 using the device interface 1230.

The device interface 1230 may facilitate communication with the host 1100 based on one or more data communication protocol(s). That is, the device interface 1230 may receive the clock CLK, the command CMD, and (optionally) write data from the host interface 1140. And in response to the received command CMD, the device interface 1230 may send the response RES corresponding to the command CMD and (optionally) read data stored in the memory device 1220 to the host 1100.

Figure 2:
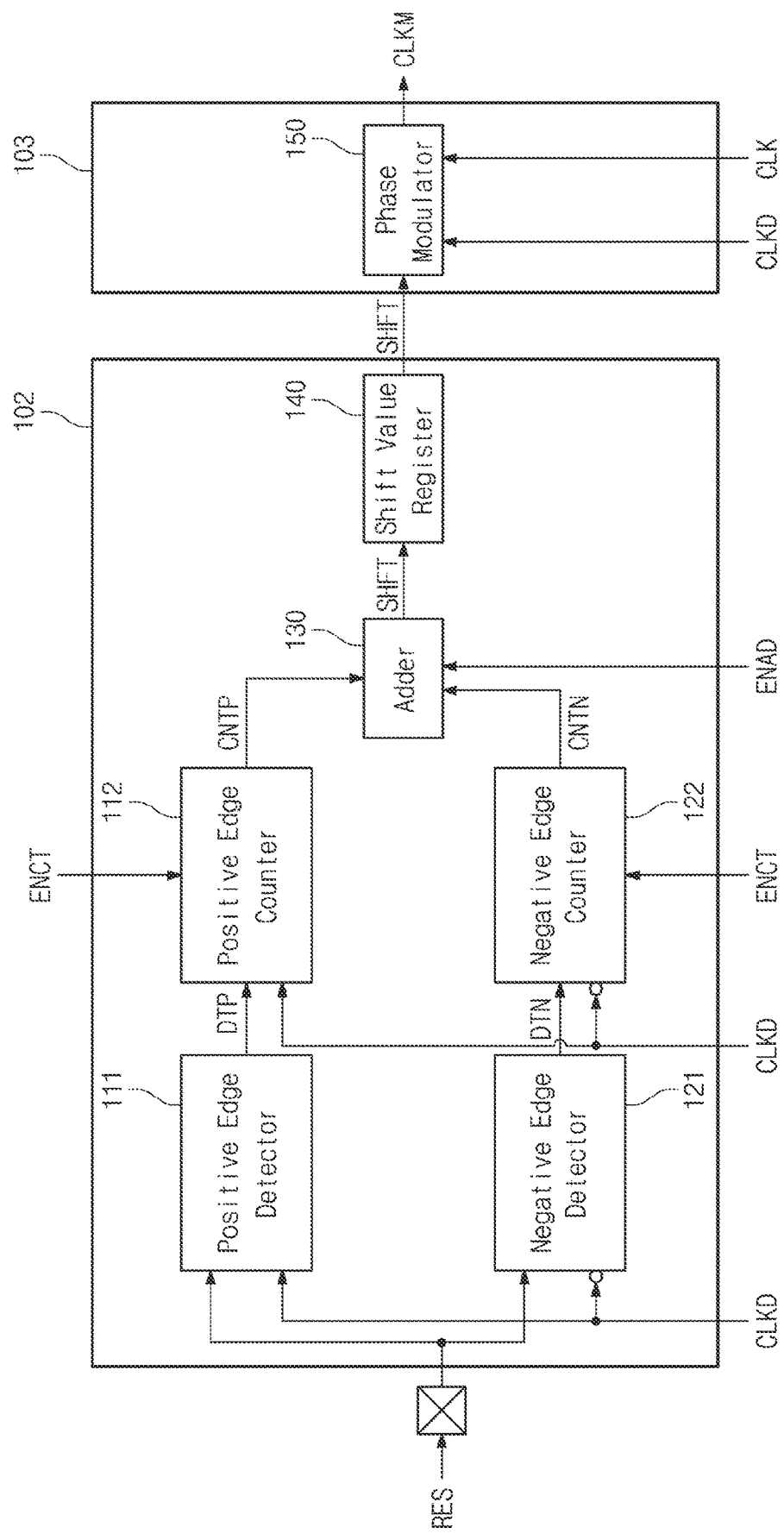
FIG. 2 is a block diagram further illustrating in one example the phase shift detector 102 and phase shifter 103 of FIG. 1.

FIG. 2 is a block diagram further illustrating in one example the phase shift detector 102 and the phase shifter 103 of FIG. 1. Referring to FIGS. 1 and 2, the phase shift detector 102 may include a positive edge detector 111, a positive edge counter 112, a negative edge detector 121, a negative edge counter 122, an adder 130, and a shift value register 140. The phase shifter 103 may include a phase modulator 150.

Some components of the phase shift detector 102 and the phase shifter 103 may operate in response to an internal clock CLKD. Here, the internal clock CLKD may be derived (or generated) by the processor 1110 from the clock CLK for internal use by in the host 1100. Thus, the control logic 101 may receive the internal clock CLKD from the processor 1110 and provide the internal clock CLKD to the phase shift detector 102 and the phase shifter 103. Alternately, the internal clock CLKD may be a clock internally generated by the control logic 101 without reference to the clock CLK for use within the host 1100 (e.g., by the phase shift detector 102 and the phase shifter 103).

The positive edge detector 111 and the negative edge detector 121 may receive the response RES from the device 1200, as well as receiving the internal clock CLKD from the control logic 101 and/or the processor 1110. The positive edge detector 111 and the negative edge detector 121 may detect a "start signal" (e.g., a falling edge—or transitioning from a logical high state (hereafter, a "high") to a logical low state (hereafter, a "low") of the response RES in relation to the internal clock CLKD. For example, the positive edge detector 111 may generate a high, positive edge detection signal DTP based on a negative edge of the response RES and a positive edge of the clock CLKD. The negative edge detector 121 may generate a high, negative edge detection signal DTN based on a negative edge of the response RES and a negative edge of the clock CLKD.

Exemplary operation of the positive edge detector 111 and the negative edge detector 121 will be described hereafter in some additional detail.

With this configuration, the positive edge counter 112 and the negative edge counter 122 may count an integer value based on a counter enable signal ENCT generated by the control logic 101 in relation to the internal clock CLKD. For example, the positive edge counter 112, upon being enabled by the counter enable signal ENCT, may count a number of positive edges of the clock CLKD from "0". The positive edge counter 112 may output the counted value as a positive edge count value CNTP in response to the positive edge detection signal DTP. Here, the negative edge counter 122 may be enabled by the counter enable signal ENCT, may count a number of negative edges of the clock CLKD, and output the counted value as a negative edge count value CNTN in response to the negative edge detection signal DTN.

Following a predetermined delay since a time at which the host 1100 sent the command CMD to the device 1200, the control logic 101 may provide (or output) a high counter enable signal ENCT. For example, the time at which the high counter enable signal ENCT is output may be determined based on a commercially-published communication standard generally associated with signal/data communication between the host 1100 and the device 1200. Alternately, a technical specification associated with the host 1100 and/or the device 1200, as well as a user initiated demand may be used to determine the time at which the high counter enable signal ENCT is output. As such, the positive edge counter 112 and the negative edge counter 122 may count a time generally beginning at the first time at which the response RES is received from the device 1200. That is, the positive edge count value CNTP and the negative edge count value CNTN may correspond to a time taken to receive the response RES from the device 1200 or a time delayed to receive the response RES.

The adder 130 may be enabled by an adder enable signal ENAD generated by the control logic 101. The adder 130 may receive the positive edge count value CNTP from the positive edge counter 112 and may receive the negative edge count value CNTN from the negative edge counter 122. The adder 130 may add (or sum) the positive edge count value CNTP and the negative edge count value CNTN. The adder 130 may then output a resulting sum of the positive edge count value CNTP and the negative edge count value CNTN as a shift value SHFT.

The shift value register 140 may be used to temporarily store the shift value SHFT received from the adder 130. The shift value register 140 may output the stored shift value SHFT to the phase modulator 150.

The phase modulator 150 may receive the shift value SHFT from the shift value register 140 of the phase shift detector 102. The phase modulator 150 may also receive the internal clock CLKD (or an integer multiplied version of the internal clock CLKD) which may be used to modulate the clock CLK. Thus, the phase modulator 150 may delay a phase of the clock CLK based on the shift value SHFT in relation to the internal clock CLKD. For example, the phase modulator 150 may delay a phase of the clock CLK, such that an amount by which the clock CLK is delayed corresponds to a product of the shift value SHFT and a period of the internal clock CLKD. In this manner, the phase modulator 150 may provide (or output) a phase-delayed version of the clock (hereafter, the "phase-delayed clock" or the "modulated clock," CLKM). Thereafter, the modulated clock CLKM may be used to process the read data received from the device 1200.

Alternately, the phase shift detector 102 may further include an adder (not shown in FIG. 2). Here, the adder may be used to add the shift value SHFT output from the shift value register 140 and a correction code provided from the control logic 101. The correction code may be determined using programming code or software executed by the processor 1110 to correct the shift value SHFT. The phase shift detector 102 may provide an addition result of the adder to the phase modulator 150 of the phase shifter 103. The phase modulator 150 may modulate a phase of the clock CLK based on the addition result of the adder. One exemplary configuration and related operation of the adder will be described hereafter in some addition detail in relation to the adder 341 of FIG. 10.

Alternately, the phase shift detector 102 may further include a multiplexer (not shown in FIG. 2). Here, multiplexer may be used to select one of the shift value SHFT and a modulation code provided from the control logic 101 to generate a selected value output to the phase modulator 150. The modulation code (e.g., a code associated with an amount by which a phase of the clock CLK is to be shifted) may be determined using programming code or software executed by the processor 1110. Thus, the phase modulator 150 may modulate a phase of the clock CLK based on the value selected provided by the multiplexer. One exemplary configuration and related operation of the multiplexer will be described hereafter in some additional detail in relation to the multiplexer 342 of FIG. 10.

Figure 3:
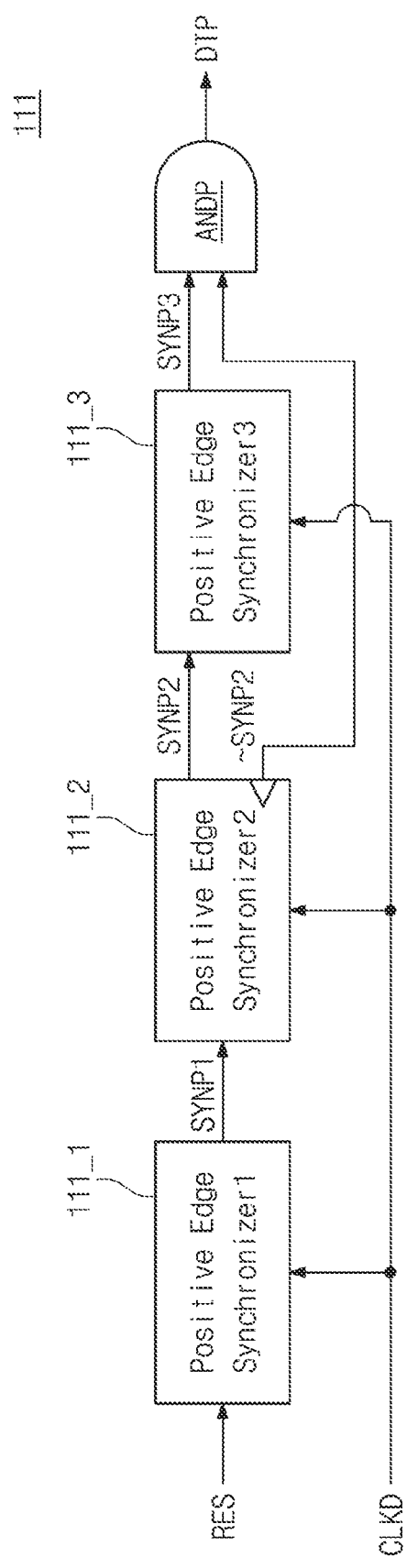
FIG. 3 is a block diagram further illustrating in one example the positive edge detector 111 of FIG. 2.

FIG. 3 is a block diagram further illustrating in one example the positive edge detector 111 of FIG. 2. Referring to FIGS. 1, 2 and 3, the positive edge detector 111 may include first, second and third (hereafter inclusively, "first to third") positive edge synchronizers 111_1, 111_2 and 111_3 (hereafter inclusively, "111_1 to 111_3"), and a positive-logic-operation AND gate, ANDP. In some embodiments, the first to third positive edge synchronizers 111_1 to 111_3 may be implemented as one or more flip-flops, but the scope of the inventive concept is not limited thereto. The first to third positive edge synchronizers 111_1 to 111_3 may be triggered by a positive edge of the internal clock CLKD.

That is, the first positive edge synchronizer 111_1 may receive the response RES from the device 1200 and the internal clock CLKD. The first positive edge synchronizer 111_1 may delay the response RES so as to be synchronized with the positive edge of the internal clock CLKD. For example, in response to toggling of the response RES, the first positive edge synchronizer 111_1 may allow a first-positive synchronizer signal SYNP1 to toggle at a next positive edge of the internal clock CLKD. The first-positive synchronizer signal SYNP1 may be regarded as a delayed response RES.

The second positive edge synchronizer 111_2 may receive the first-positive synchronizer signal SYNP1 output from the first positive edge synchronizer 111_1 and the internal clock CLKD. In response to toggling by the first-positive synchronizer signal SYNP1, the second positive edge synchronizer 111_2 may allow a second-positive synchronizer signal SYNP2 to toggle at a next positive edge of the internal clock CLKD. The second-positive synchronizer signal SYNP2 may be regarded as a delayed version of the first-positive synchronizer signal SYNP1. The second positive edge synchronizer 111_2 may also output an inverted version (e.g., ~SYNP2) of the second-positive synchronizer signal SYNP2 to the positive-logic operation AND gate, ANDP.

The third positive edge synchronizer 111_3 may receive the second-positive synchronizer signal SYNP2 output from the second positive edge synchronizer 111_2 and the internal clock CLKD. In response to toggling of the second-positive synchronizer signal SYNP2, the third positive edge synchronizer 111_3 may allow a third-positive synchronizer signal SYNP3 to toggle at a next positive edge of the internal clock CLKD. The third-positive synchronizer signal SYNP3 may be regarded as a delayed version of the second-positive synchronizer signal SYNP2.

The positive-logic-operation AND gate, ANDP, may be used to perform a logical 'AND' operation on the third-positive synchronizer signal SYNP3 and the inverted second-positive synchronizer signal SYNP2 in order to generate the positive edge detection signal DTP.

Figure 4:
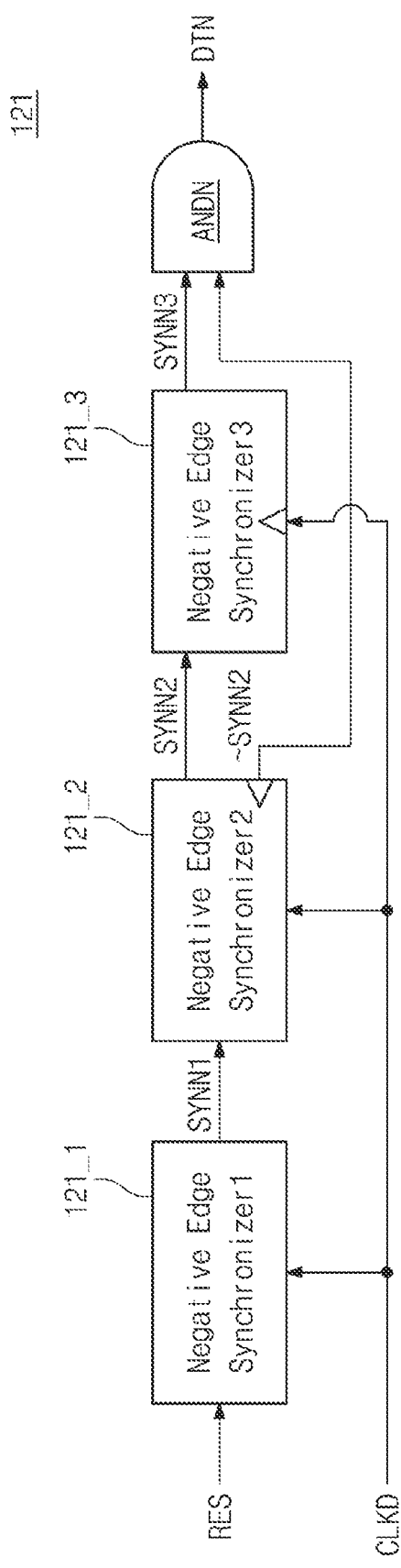
FIG. 4 is a block diagram further illustrating in one example the negative edge detector 121 of FIG. 2.

FIG. 4 is a block diagram further illustrating in one example the negative edge detector 121 of FIG. 2. Referring to FIGS. 1, 2, 3 and 4, the negative edge detector 121 may include first to third negative edge synchronizers 121_1 to 121_3 and a negative-logic-operation AND gate, ANDN.

The first to third negative edge synchronizers 121_1 to 121_3 may be triggered by a negative edge of the internal clock CLKD. The configuration and operation of the first to third negative edge synchronizers 121_1 to 121_3 may be substantially analogous to that of the first to third positive edge synchronizers 111_1 to 111_3. For example, in response to toggling by the response RES, the first negative edge synchronizer 121_1 may allow a first-negative synchronizer signal SYNN1 to toggle at a next negative edge of the internal clock CLKD, and in this case, the synchronizer signal SYNN1 may be regarded as a delayed version of the response RES. The second negative edge synchronizer 121_2 may allow the first-negative synchronizer signal SYNN1 to toggle at a next negative edge of the internal clock CLKD, such that a second-negative synchronizer signal SYNN2, or a delayed version of the first-negative synchronizer signal SYNN1 is output to the third negative edge synchronizer 121_3 along with an inverted version (e.g., ~SYNN2) of the second-negative synchronizer signal SYNN2 is output to the negative-logic-operation AND gate, ANDN. The third negative edge synchronizer 121_3 may allow the second-negative synchronizer signal SYNN2 to toggle at a next negative edge of the internal clock CLKD such that a third-negative synchronizer signal SYNN3 is output to the negative-logic-operation AND gate, ANDN.

Hence, the negative-logic-operation AND gate, ANDN, may perform a logical 'AND' operation on the third-negative synchronizer signal SYNN3 and the inverted version of the second-negative synchronizer signal SYNN2 to generate the negative edge detection signal DTN.

Figure 5:
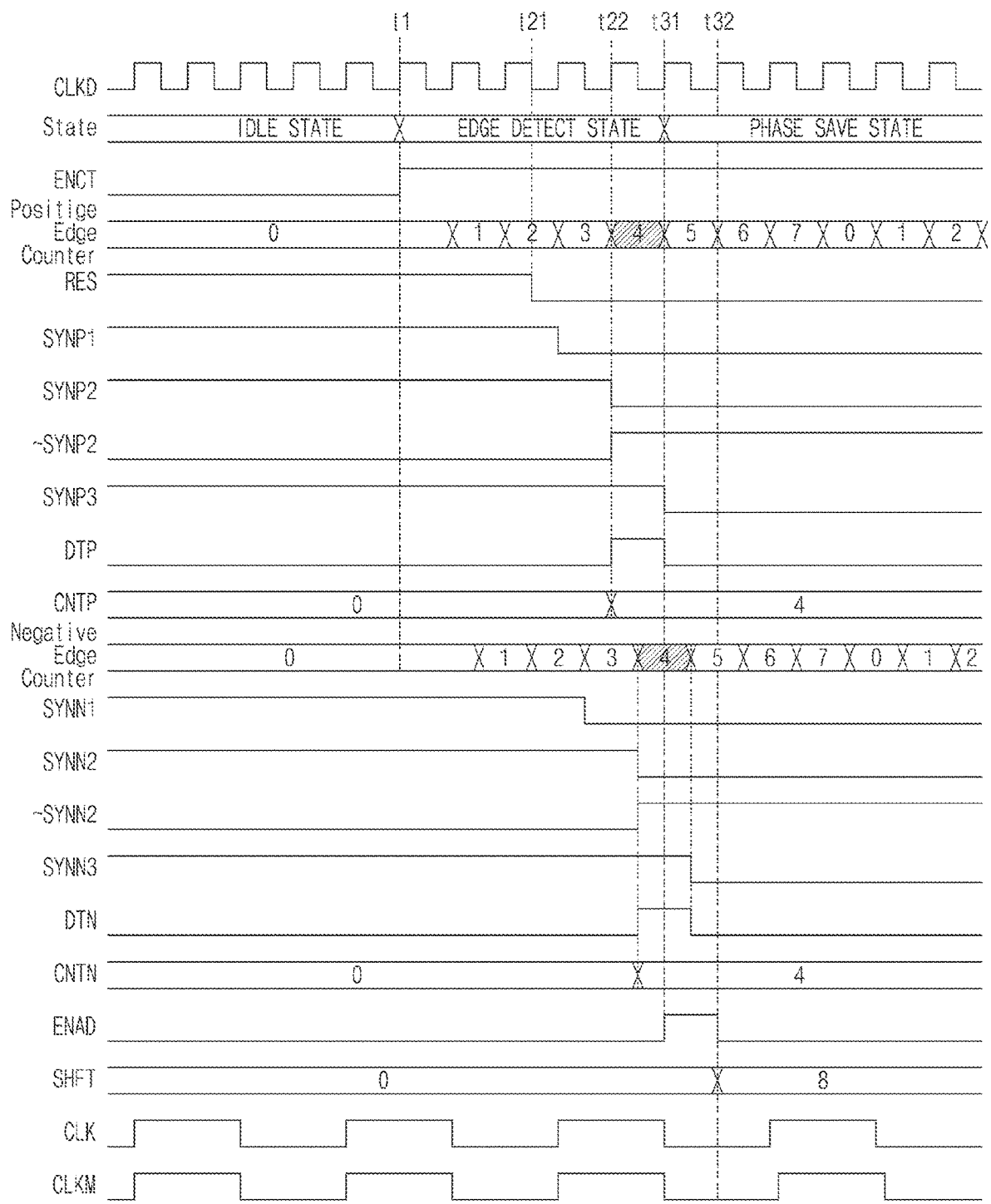
FIG. 5 is a signal timing diagram illustrating operation of a clock modulator according to embodiments of the inventive concept.

FIG. 5 is a signal timing diagram illustrating operation of the clock modulator 100 of FIG. 1 according to embodiments of the inventive concept. Operation of the clock modulator 100 provides (or outputs) the modulated clock CLKM—which is generated by modulating the clock CLK based on the response RES received from the device 1200 as described herein in relation to FIGS. 1, 2, 3, 4 and 5.

In this regard, a state of the phase shift detector 102 may be controlled by the control logic 101. For example, in response to a request from the processor 1110, the control logic 101 may power-on the phase shift detector 102 and set the phase shift detector 102 in an idle state. When the phase shift detector 102 is powered-on, the positive edge detector 111, the positive edge counter 112, the negative edge detector 121, the negative edge counter 122, the adder 130, and the shift value register 140 of the phase shift detector 102 may be reset (or initialized) to a value of "0". Thereafter, the control logic 101 may set the state of the phase shift detector 102 to the idle state until a given delay passes following the first time at which the clock CLK and the command CMD were sent to the device 1200 via the host interface 1140. In some embodiments, a time (e.g., expressed a counted value) during which the phase shift detector 102 remains in the idle state following the first time may be predetermined (e.g., with reference to a technical standard associated with a secure digital (SD) card, the device 1200 and/or the host 1100). Alternately, the delay may be determined by a user demand.

In the embodiment illustrated in FIG. 5, during the idle state before time t1 (e.g., the first time at which the clock CLK and command CMD are sent to the device 1200), the counter enable signal ENCT may be low. As such, the positive edge counter 112 and the negative edge counter 122 may not operate (e.g., may maintain "0" as an initial value).

At time t1, the control logic 101 may change the state of the phase shift detector 102 from the idle state to an edge detect state. As such, the counter enable signal ENCT output by the control logic 101 may transition from low to high. The positive edge counter 112 and the negative edge counter 122 are enabled by the counter enable signal ENCT and the internal clock CLKD. In some embodiments like the one illustrated in FIG. 5, each of the positive edge counter 112 and the negative edge counter 122 may be implemented with a 3-bit counter, but the scope of the inventive concept is not limited thereto.

At time t21, the response RES is received from the device 1200 (e.g., transitioning from high to low). Based on the response RES falling, the first positive edge synchronizer 111_1 of the positive edge detector 111 allows the first-positive synchronizer signal SYNP1 to toggle at a next positive edge of the internal clock CLKD. Based on toggling by the first-positive synchronizer signal SYNP1, the second positive edge synchronizer 111_2 of the positive edge detector 111 may allow the second-positive synchronizer signal SYNP2 and the inverted version of the second-positive synchronizer signal SYNP2 to toggle at a next positive edge of the internal clock CLKD. Based on toggling of the second-positive synchronizer signal SYNP2, the third positive edge synchronizer 111_3 of the positive edge detector 111 may allow the third-positive synchronizer signal SYNP3 to toggle at a next positive edge of the internal clock CLKD. Hence, the positive-logic operation AND gate, ANDP, may output the positive edge detection signal DTP corresponding to a high during one cycle of the internal clock CLKD at time t22, based on the third-positive synchronizer signal SYNP3 and the inverted second-positive synchronizer signal ~SYNP2.

When the positive edge detection signal DTP rises from low to high, a value counted by the positive edge counter 112 may be output as the positive edge count value CNTP. In the illustrated embodiment of FIG. 5, the positive edge count value CNTP may correspond to integer "4".

As previously described, based on that the response RES transitioning from high to low, the first negative edge synchronizer 121_1 of the negative edge detector 121 may allow the first-negative synchronizer signal SYNN1 to toggle at a next negative edge of the internal clock CLKD. Based on toggling of the first-negative synchronizer signal SYNN1, the second negative edge synchronizer 121_2 of the negative edge detector 121 may allow the second-negative synchronizer signal SYNN2 and the inverted version (~SYNN2) of the second-negative synchronizer signal SYNN2 to toggle at a next negative edge of the internal clock CLKD. Based on toggling of the second-negative synchronizer signal SYNN2, the third negative edge synchronizer 121_3 of the negative edge detector 121 may allow the third-negative synchronizer signal SYNN3 to toggle at a next negative edge of the internal clock CLKD. After a half cycle of the internal clock CLKD passes time t22, the negative-logic-operation AND gate, ANDN, outputs the negative edge detection signal DTN corresponding to a high during one cycle of the internal clock CLKD, based on the third-negative synchronizer signal SYNN3 and the inverted version of the second-negative synchronizer signal ~SYNN2.

When the negative edge detection signal DTN rises from low to high, a value counted by the negative edge counter 122 may be output as the negative edge count value CNTN. In the illustrated embodiment of FIG. 5, the negative edge count value CNTN may correspond to integer "4".

In response to that the positive edge detection signal DTP output from the positive edge detector 111 transitioning from high to low at time t31, the control logic 101 may change the state of the phase shift detector 102 from the edge detect state to a phase save state. As such, the adder enable signal ENAD output from the control logic 101 may transition from low to high at time t31, and the high adder enable signal ENAD may be maintained during one cycle of the internal clock CLKD (e.g., a time interval between time t31 and time t32). In response to the adder enable signal ENAD, the adder 130 may add the positive edge count value CNTP output from the positive edge counter 112 and the negative edge count value CNTN.

At time t32, the adder 130 may output the shift value SHFT to the shift value register 140. The shift value register 140 may output a modulation signal STM to the phase modulator 150, based on the shift value SHFT. The phase modulator 150 may modulate the clock CLK based on the modulation signal STM. In the illustrated embodiment of FIG. 5, the shift value SHFT may correspond to integer "8". As such, the phase modulator 150 may delay a phase of the clock CLK as much as 8 periods (or cycles) of the internal clock CLKD. The phase modulator 150 may output the modulated clock CLKM which is delayed with respect to the clock CLK by 8 periods of the internal clock CLKD.

In the illustrated embodiment of FIG. 5, the period of the internal clock CLKD used during operation of the clock modulator 100 has been exaggeratedly for illustrative purposes. That is, for convenience of illustration, a phase difference between the internal clock CLKD and the modulated clock CLKM has been shown in relatively smaller than may occur under actual operating conditions.

Alternately, the control logic 101 may change the state of the phase shift detector 102 from the phase save state to the idle state. For example, in response to that the host 1100 sending a next command CMD to the device 1200, the control logic 101 may again change the state of the phase shift detector 102 to the idle state. For another example, the control logic 101 may again change the state of the phase shift detector 102 to the idle state in response to an update request of the processor 1110.

Figure 6:
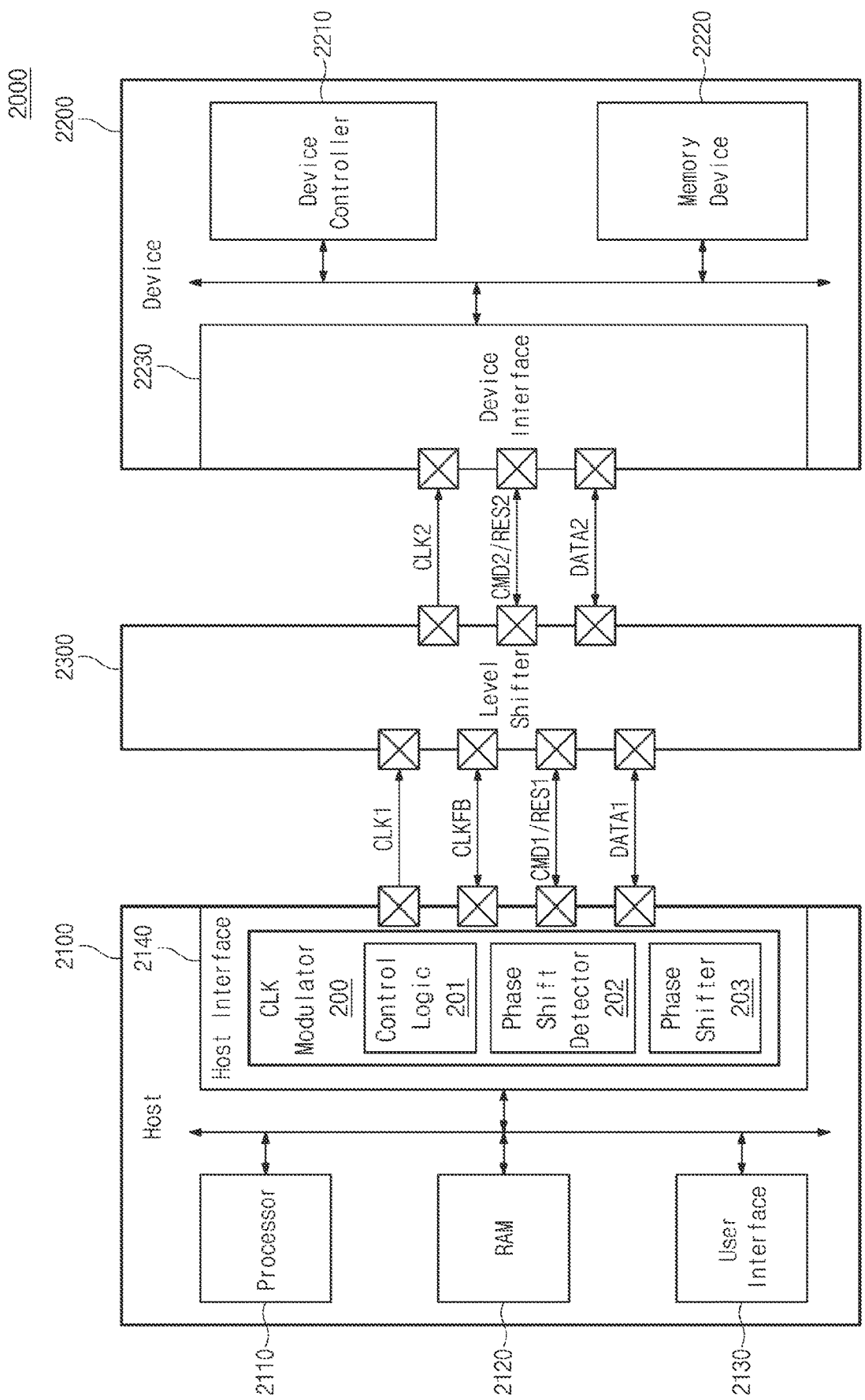
FIG. 6 is a block diagram illustrating a memory system according to embodiments of the inventive concept.

FIG. 6 is a block diagram illustrating a memory system 2000 according to embodiments of the inventive concept. Referring to FIG. 6, the memory system 2000 may generally include a host 2100, a device 2200, and a level shifter 2300.

The host 2100 may include a processor 2110, a RAM 2120, a user interface 2130, and a host interface 2140. The configurations and operation of the processor 2110, the RAM 2120, and the user interface 2130 may be substantially similar to that previously described in relation to the processor 1110, the RAM 1120, and the user interface 1130 of FIG. 1.

The host interface 2140 may facilitate communication (e.g., wirelessly and/or in a hardwired configuration) between a device and the host 2100. For example, the host 2100 may communicate with the device 2200 through the host interface 2140 and the level shifter 2300 using one or more communication protocols.

The host interface 2140 may send, to the device 2200, a clock CLK1 determined for communication with the device 2200 by an operative protocol associated with the host interface 2140, a command CMD1 controlling operation of the device 2200, and first data DATA1 to be stored in the device 1200. By way of comparison with the illustrated embodiment of FIG. 1, the host interface 2140 of FIG. 6 may receive a response RES1 corresponding to the command CMD1 and second data DATA2 stored in the device 2200 through the level shifter 2300 from the device 2200. The host interface 2140 may also receive a feedback clock CLKFB from the level shifter 2300. The feedback clock CLKFB may be a signal returned to the host 2100 after the clock CLK1 provided to the level shifter 2300 is fed back by the level shifter 2300.

The host interface 2140 may include a clock modulator 200. The configuration and operation of the clock modulator 200 may be substantially similar to that of the clock modulator 100 of FIG. 1. For example, the clock modulator 200 may include control logic 201, a phase shift detector 202, and a phase shifter 203. As previously described in relation to the control logic 101 of FIG. 1, the control logic 201 may generate various control signals that control operation of the phase shift detector 202 and the phase shifter 203.

However, in contrast to the embodiment illustrated in FIG. 1, the phase shift detector 202 of FIG. 6 may determine an amount, by which a phase of the clock CLK1 used in communication with the device 2200 is to be shifted, based on at least one of the response RES1 and the feedback clock CLKFB under control of the control logic 201. As in the phase shifter 103 of FIG. 1, the phase shifter 203 of FIG. 6 may modulate a phase of the clock CLK1 based on a value determined by the phase shift detector 202 under control of the control logic 201. The host 2100 may process first data DATA1 received from the device 2200 through the level shifter 2300 by using a clock modulated by the phase shifter 203.

In some embodiments, the clock modulator 200 may count a time (e.g., a counted value) from a first time at which the command CMD1 is sent to the device 2200 from the host 2100 to a second time at which the response RES1 is received from the device 2200 through the level shifter 2300, and may delay a phase of the clock CLK1 based on the counted value.

Alternately, in some embodiments, the clock modulator 200 may count a time (e.g., a counted value) from a first time at which the clock CLK1 is sent to the level shifter 2300 to a second time at which the feedback clock CLKFB is received from the level shifter 2300, and may delay a phase of the clock CLK1 based on the counted value. For example, the phase shift detector 202 may start a counting operation once a predetermined time passes following the first time at which the clock CLK1 is sent to the device 2200, and may output the counted value to the phase shifter 203 in response to that the feedback clock CLKFB is received from the level shifter 2300. The phase shifter 203 may delay a phase of the clock CLK1, based on the value counted by the phase shift detector 202.

In some embodiments, second data DATA2 sent from the device 2200 may be delayed by the level shifter 2300 and then be received by the host 2100 as first data DATA1. As such, a valid window for the first data DATA1 may be delayed with respect to the second data DATA2. Hence, the phase shifter 203 may modulate a phase of the clock CLK1 in consideration of a delay of the first data DATA1 due to the level shifter 2300. As the host 2100 uses the clock modulated by the phase shifter 203 instead of the clock CLK1 used in the communication with the device 2200, the host 2100 may process the first data DATA1 received from the device 2200 more accurately and efficiently, thereby preventing possible loss in the transfer of the second DATA2. For example, as the host interface 2140 may sample the first data DATA1 based on the modulated clock CLKM, the sampled first data DATA1 may be substantially the same as the second data DATA2 transferred from device 2200. Operation of the phase shift detector 202 and the phase shifter 203 will be described hereafter in some additional detail.

The level shifter 2300 may regulate a voltage level of signals output from the host 2100 and the device 2200. For example, the level shifter 2300 may regulate voltage levels of the clock CLK1, the command CMD1, and the first data DATA1 output from the host 2100 to a voltage level capable of being processed at the device 2200. The level shifter 2300 may send the regulated signals, that is, a regulated clock CLK2, a command CMD2, and the second data DATA2 to the device 2200. As in the above description, the level shifter 2300 may regulate voltage levels of the regulated clock CLK2, a response RES2, and the data DATA2 output from the device 2200 to a voltage level capable of being processed at the host 2100 and may send the regulated signals to the host 2100. The level shifter 2300 may return the feedback clock CLKFB to the host 2100 with regard to the clock CLK1 received from the host 2100. For example, the feedback clock CLKFB may be a clock returned to the host 2100 by (1) regulating a voltage level of the clock CLK1 received from the host 2100, and (2) again inversely regulating the regulated voltage level.

The configuration and operation of the device 2200 may be substantially similar to that of the device 1200 of FIG. 1. The device 2200 may include a device controller 2210, a memory device 2220, and a device interface 2230. The configuration and operation of the device controller 2210, the memory device 2220, and the device interface 2230 may be respectively similar to that of the device controller 1210, the memory device 1220, and the device interface 1230 of FIG. 1.

In contrast to the device 1200 of FIG. 1, the device 2200 of FIG. 6 may receive signals output from the host 2100 through the level shifter 2300. For example, the device 2200 may receive the regulated clock CLK2, the command CMD2, and the second data DATA2, which are regulated by the level shifter 2300. In response to the command CMD2, the device 2200 may send the response RES2 and the second data DATA2 to the level shifter 2300. The response RES2 and the second data DATA2 may be regulated (or converted) by the level shifter 2300 so as to be provided to the host 2100 as the response RES1 and the first data DATA1.

Figure 7:
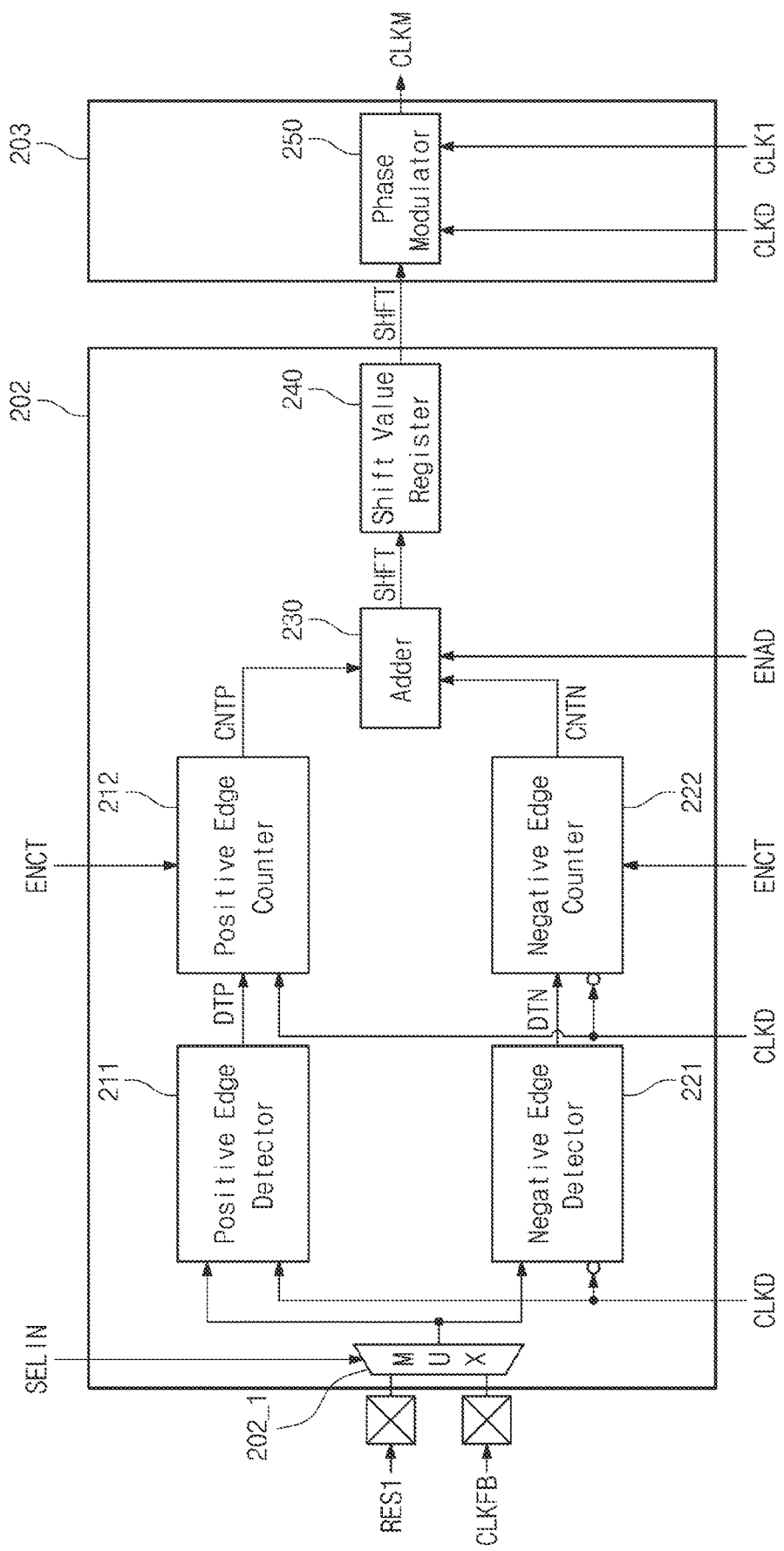
FIG. 7 is a block diagram further illustrating in one example the phase shift detector 202 and phase shifter 203 of FIG. 6.

FIG. 7 is a block diagram further illustrating in one example the phase shift detector 202 and the phase shifter 203 of FIG. 6. Here, the phase shift detector 202 may include a multiplexer 202_1, a positive edge detector 211, a positive edge counter 212, a negative edge detector 221, a negative edge counter 222, an adder 230, and a shift value register 240, and the phase shifter 203 may include a phase modulator 250. Only material differences between the phase shift detector 102 of FIG. 2 and the phase shift detector 202 of FIG. 7 will be described in relation to FIGS. 1, 2, 6, and 7.

In contrast to the phase shift detector 102 of FIG. 2, the phase shift detector 202 of FIG. 7 may further include the multiplexer 202_1. Under control of the processor 210, the control logic 201 may generate an input selection signal SELIN for selecting one of the response RES1 and the feedback clock CLKFB. The multiplexer 202_1 may output one of the response RES1 and the feedback clock CLKFB provided from the level shifter 2300, as a selected value, in response to the input selection signal SELIN.

The configuration and operation of the positive edge detector 211, the positive edge counter 212, the negative edge detector 221, the negative edge counter 222, the adder 230, and the shift value register 240 of the phase shift detector 202 and the phase modulator 250 of the phase shifter 203 may be similar to that previously described in relation to the positive edge detector 111, the positive edge counter 112, the negative edge detector 121, the negative edge counter 122, the adder 130, the shift value register 140 of the phase shift detector 102, and the phase modulator 150 of the phase shifter 103 of FIG. 2. For example, when the response RES1 is selected by the multiplexer 202_1, the components of the phase shift detector 202, the component of the phase modulator 250, and the control logic 201 may operate in a substantially similar manner, as previously described in relation to FIGS. 3, 4 and 5.

When the feedback clock CLKFB is selected by the multiplexer 202_1, the positive edge detector 211 and the negative edge detector 221 may respectively output the positive edge detection signal DTP and the negative edge detection signal DTN, based on the feedback clock CLKFB instead of the response RES1. The configuration and operation of the positive edge detector 211 may be substantially similar to that of the positive edge detector 111 of FIG. 3. However, in contrast to the positive edge detector 111 of FIG. 3, synchronizers of the positive edge detector 211 may output the positive synchronizer signals SYNP1, SYNP2, ~SYNP2, and SYNP3 based on the feedback clock CLKFB instead of the response RES1. As in the above description, the configuration and operation of the negative edge detector 221 may be substantially similar to that of the negative edge detector 121 of FIG. 4, but negative synchronizers of the negative edge detector 221 may output the negative synchronizer signals SYNN1, SYNN2, ~SYNN2, and SYNN3 based on the feedback clock CLKFB instead of the response RES1. The configuration and operation of the phase shift detector 202, the phase shifter 203, and the control logic 201 when the feedback clock CLKFB is selected by the multiplexer 202_1 will be described hereafter in some additional detail.

Figure 8:
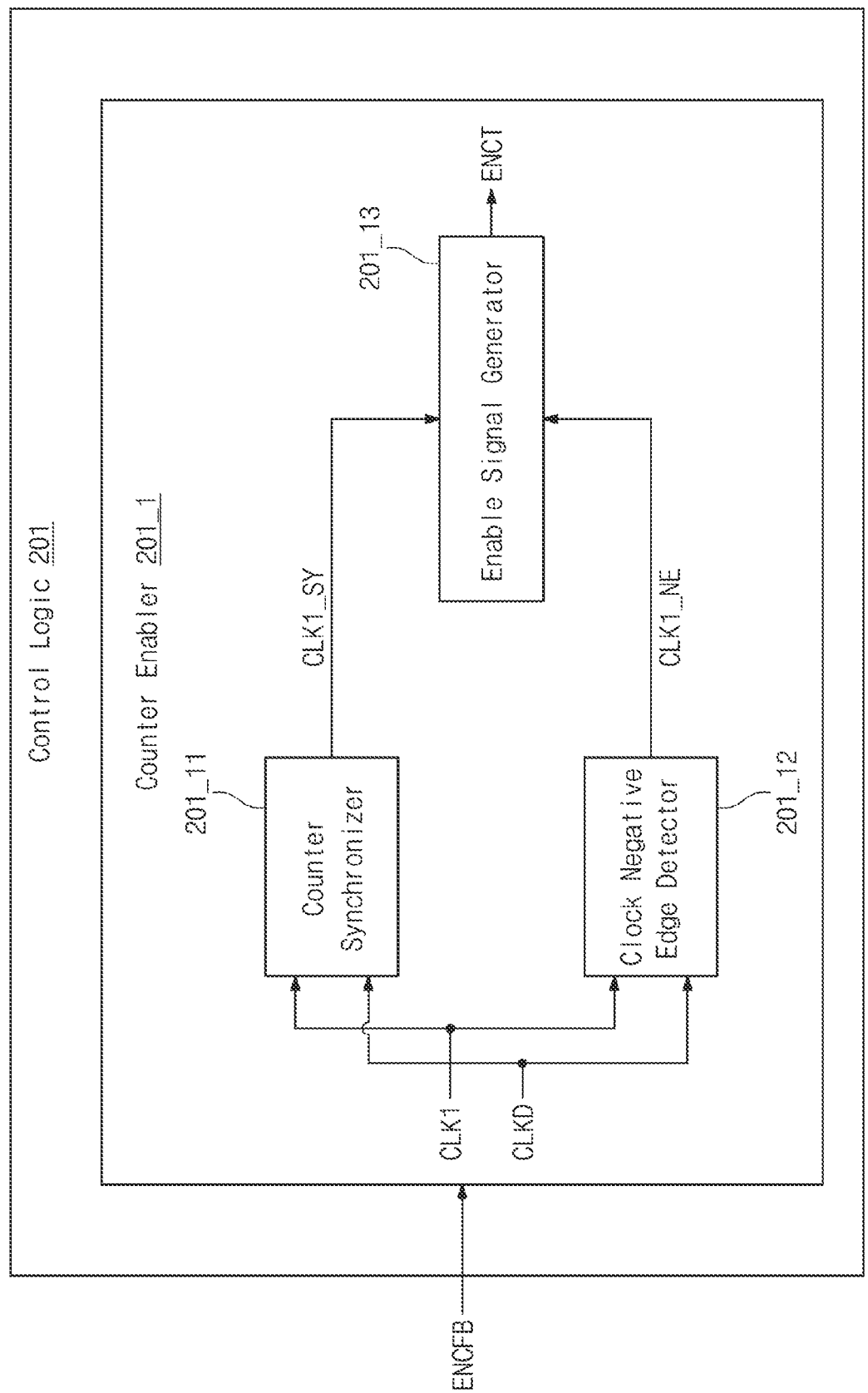
FIG. 8 is a block diagram further illustrating in one example the control logic 201 of FIG. 6.

FIG. 8 is a block diagram illustrating in one example the control logic 201 of FIG. 6. Referring to FIGS. 6, 7, and 8, the control logic 201 may include a counter enabler 201_1.

The counter enabler 201_1 may receive a feedback clock enable signal ENCFB from the processor 2110. The feedback clock enable signal ENCFB may be a signal that allows the clock modulator 200 to modulate the clock CLK1 based on the feedback clock CLKFB. When the feedback clock enable signal ENCFB is high, the control logic 201 may provide the input selection signal SELIN for selecting the feedback clock CLKFB to the multiplexer 202_1 of the phase shift detector 202 and may enable the counter enabler 201_1. When the feedback clock enable signal ENCFB is low, the control logic 201 may provide the input selection signal SELIN for selecting the response RES1 to the multiplexer 202_1 of the phase shift detector 202, and may provide the counter enable signal ENCT to the phase shift detector 202 in the manner described with reference to FIG. 5, instead of enabling the counter enabler 201_1.

The counter enabler 201_1 may include a counter synchronizer 201_11, a clock negative edge detector 201_12, and an enable signal generator 201_13. The counter synchronizer 201_11 may be implemented with an element such as a flip-flop. The counter synchronizer 201_11 may receive the clock CLK1 and the multiplied internal clock CLKD. In response to toggling of the clock CLK1, the counter synchronizer 201_11 may output a clock CLK1_SY at a next positive edge of the multiplied internal clock CLKD. The clock CLK1_SY may be regarded as a signal that is obtained by delaying the clock CLK1 as much as one cycle of the internal clock CLKD.

The clock negative edge detector 201_12 may receive the clock CLK1 and the multiplied internal clock CLKD. In response to a negative edge of the clock CLK1, the clock negative edge detector 201_12 may generate a high clock CLK1_NE during one cycle of the internal clock CLKD. The clock negative edge detector 201_12 may output the clock CLK1_NE to the enable signal generator 201_13.

The enable signal generator 201_13 may generate the counter enable signal ENCT, based on the clock CLK1_SY and the clock CLK1_NE. The enable signal generator 201_13 may generate the counter enable signal ENCT, based on the clock CLK1_SY and the clock CLK1_NE. The counter enable signal ENCT generated by the enable signal generator 201_13 may be high from a time at which the clock CLK1_SY, and the clock CLK1_NE simultaneously transition from high to low for the first time after the phase shift detector 202 is powered-on (or initialized). The counter enable signal ENCT may be reset to low by a request of the processor 2110.

When the feedback clock enable signal ENCFB is low, the counter enabler 201_1 may generate the counter enable signal ENCT based on the response RES1, without enabling the counter synchronizer 201_11 and the clock negative edge detector 201_12. For example, the host 2100 may further include a counter configured to count a delay time of the response RES1. The counter that counts the delay time of the response RES1 may count a time that is in advance determined based on the standard associated with communication between the host 2100 and the device 2200, the specification of the host 2100 or the device 2200, or a demand of the user, and may output a high signal when the counted time exceeds the time determined in advance. In response to the high signal output from the counter counting the delay time of the response RES1, the enable signal generator 201_13 may output the high counter enable signal ENCT.

After a given delay following a time at which the clock CLK1 is sent to the level shifter 2300, the positive edge counter 212 and the negative edge counter 222 may be enabled in response to the high counter enable signal ENCT. As such, the positive edge counter 212 and the negative edge counter 222 may count a time (e.g., a counted value) by which the reception of the feedback clock CLKFB is delayed.

Figure 9:
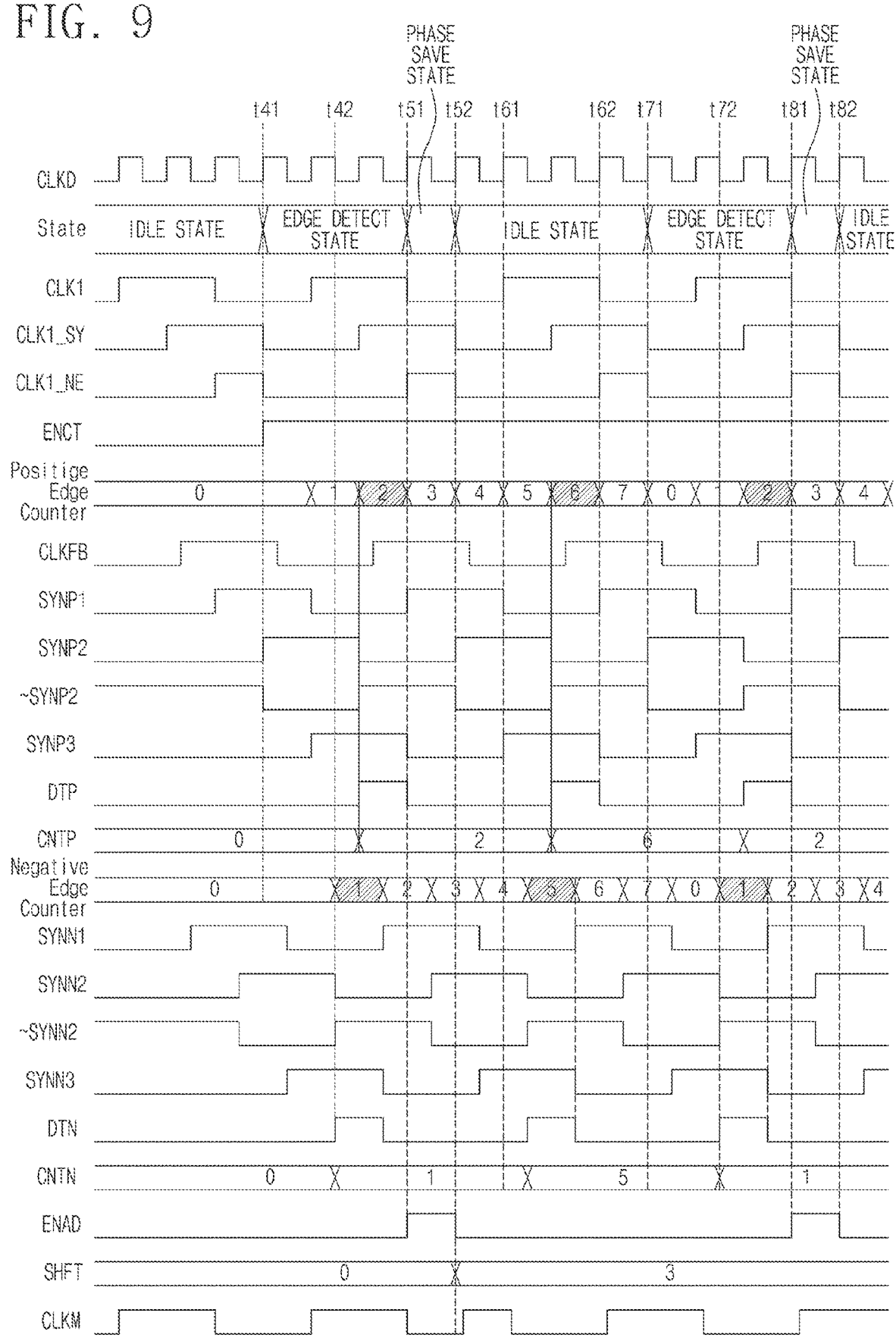
FIG. 9 is a signal timing diagram illustrating operation of a clock modulator according to embodiments of the inventive concept.

FIG. 9 is a signal timing diagram illustrating operation of the clock modulator 200 of FIG. 6. Here, operation of the clock modulator 200 provides (or outputs) the modulated clock CLKM (e.g., the clock CLK1 modulated based on the feedback clock CLKFB) as will be described hereafter with reference to FIGS. 6, 7, 8 and 9.

Similar to the approach manner described in relation to the embodiment of FIG. 5, a state of the phase shift detector 202 may be controlled by the control logic 201. For example, the control logic 201 may power-on (or initialize) the phase shift detector 202 in response to a request from the processor 2110. The control logic 201 may set the state of the phase shift detector 202 to the idle state until a predetermined delay has elapsed from a the first time (e.g., a time at which the clock CLK1 and the command CMD1 were sent by the host interface 2140 to the device 2200 through the level shifter 2300). After the predetermined delay, the control logic 201 may change the state of the phase shift detector 202 from the idle state to the edge detect state. Here, the duration of the idle state of the phase shift detector 202 may be determined based on one or more technical standards associated with a communication protocol, the host 2100 and/or the device 2200.

Alternately, the duration of the idle state of the phase shift detector 202 may be determined according to a user demand Alternately, the duration of the idle state of the phase shift detector 202 may be determined by the control logic 201_1 in response to the state (e.g., a high) of the counter enable signal ENCT provided by the counter enabler 201_1.

In the illustrated embodiment of FIG. 9, during the idle state a level of the counter enable signal ENCT is low before time t41. As such, the positive edge counter 212 and the negative edge counter 222 do not operate.

In response to toggling of the clock CLK1, the counter synchronizer 201_11 of the counter enabler 201_1 may output a synchronized clock CLK1_SY at a next positive edge of the internal clock CLKD. In response to a negative edge of the clock CLK1, the clock negative edge detector 201_12 may generate a negative clock CLK1_NE (e.g., having a high logical state) during one cycle of the internal clock CLKD. The enable signal generator 201_13 may generate the counter enable signal ENCT having a high logical state when the synchronized clock CLK1_SY and the negative clock CLK1_NE simultaneously transition from high to low for the first time after the phase shift detector 202 is enabled (e.g., at time t41) until the phase shift detector 202 is reset. When the counter enable signal ENCT transitions from low to high at time t41, the state of the phase shift detector 202 may be changed from the idle state to the edge detect state, and the positive edge counter 212 and the negative edge counter 222 may be enabled.

In response to toggling of the feedback clock CLKFB, the first positive edge synchronizer of the positive edge detector 211 may allow a first-positive synchronizer signal SYNP1 to toggle at a next positive edge of the internal clock CLKD. In response to toggling of the first-positive synchronizer signal SYNP1, a second positive edge synchronizer of the positive edge detector 211 may allow the second-positive synchronizer signal SYNP2 to toggle at a next positive edge of the internal clock CLKD. This signal may be inverted to generate an inverted second-positive synchronizer signal ~SYNP2. In response to toggling of the second-positive synchronizer signal SYNP2, the third positive edge synchronizer of the positive edge detector 211 may allow a third-positive synchronizer signal SYNP3 to toggle at a next positive edge of the internal clock CLKD. A positive-logic-operation AND gate, ANDP, associated with the positive edge detector 211 may provide the positive edge detection signal DTP by performing a logical 'AND' operation on the third-positive synchronizer signal SYNP3 and the inverted second-positive synchronizer signal ~SYNP2.

When the positive edge detection signal DTP transitions from low to high, a value counted by the positive edge counter 212 may be output as the positive edge count value CNTP. In the illustrated embodiment of FIG. 9, the positive edge count value CNTP may correspond to integer "2".

Analogously, in response to toggling of the feedback clock CLKFB, the first negative edge synchronizer of the negative edge detector 221 may allow a first-negative synchronizer signal SYNN1 to toggle at a next negative edge of the internal clock CLKD. In response to toggling of the first-negative synchronizer signal SYNN1, the second negative edge synchronizer of the negative edge detector 221 may allow a second-negative synchronizer signal SYNN2 to toggle at a next negative edge of the internal clock CLKD. Thus signal may be inverted to generate an inverted second-negative signal ~SYNN2. In response to toggling of the second-negative synchronizer signal SYNN2, the third negative edge synchronizer of the negative edge detector 221 may allow a third-negative synchronizer signal SYNN3 to toggle at a next negative edge of the internal clock CLKD. A negative-logic-operation AND gate, ANDN, associated with the negative edge detector 221 may provide the negative edge detection signal DTN by performing a logical 'AND' operation on the third-negative synchronizer signal SYNN3 and the inverted second-negative synchronizer signal ~SYNN2.

When the negative edge detection signal DTN transitions from low to high (e.g., at time t42), a counted value determined by the negative edge counter 222 may be output as the negative edge count value CNTN. In the illustrated embodiment of FIG. 9, the negative edge count value CNTN may correspond to integer "1".

Similar to the approach previously described in relation to the embodiment of FIG. 5, in response to the positive edge detection signal DTP output by the positive edge detector 211 (e.g., a transition from high to low at time t51), the control logic 201 may change the state of the phase shift detector 202 from the edge detect state to the phase save state. As the positive edge detection signal DTP transitions from high to low, the adder enable signal ENAD having a high logical state may be output from the control logic 201 during one cycle of the internal clock CLKD. In response to the adder enable signal ENAD, the adder 230 may add the positive edge count value CNTP and the negative edge count value CNTN.

At time t52, the adder 230 may output the determined (or calculated) the shift value SHFT to the shift value register 240. The shift value register 240 may output the shift value SHFT to the phase modulator 250. The phase modulator 250 may modulate the clock CLK, based on the shift value SHFT. In the illustrated embodiment of FIG. 9, the shift value SHFT may correspond to integer "3". The phase modulator 250 may delay a phase of the clock CLK1 by as much as 3 periods of the internal clock CLKD, and output the delayed clock CLK1 as the modulated clock CLKM. Thereafter, the state of the phase shift detector 202 may return to the idle state under the control of the control logic 201.

In contrast to the approach described in relation to FIG. 5, in the illustrated embodiment in FIG. 9, following one period of the internal clock CLKD from a time at which the state of the phase shift detector 202 is changed to the phase save state, the control logic 201 may again change the state of the phase shift detector 202 to the idle state. In the idle state, even though the positive edge count value CNTP and the negative edge count value CNTN are changed in response to the positive edge detection signal DTP and the negative edge detection signal DTN, the adder 230 is not enabled. Accordingly, even though the positive edge count value CNTP and the negative edge count value CNTN are changed, the shift value SHFT stored in the shift value register 240 does not change.

For example, at time following a half cycle of the internal clock CLKD from time t61, the negative edge detection signal DTN may transition from low to high, and thus, the negative edge count value CNTN may be updated to "5". As this approach, following the half the cycle of the internal clock CLKD, the positive edge detection signal DTP may transition from low to high, and thus, the positive edge count value CNTP may be updated to "6". However, the adder enable signal ENAD does not transition from low to high, and thus, the adder 230 will not perform the addition operation.

Following a time determined in advance by the processor 2110, the control logic 201 may change the state of the phase shift detector 202 to the edge detect state. For example, in the idle state, in response to that the negative clock CLK1_NE transitioning from high to low, the control logic 201 may change the state of the phase shift detector 202 to the edge detect state. Alternately, in response to a value of the positive edge counter 212 again being "0", the control logic 201 may change the state of the phase shift detector 202 to the edge detect state.

For example, at time t71, in response to the negative clock CLK1_NE transitioning from high to low, the control logic 201 may change the state of the phase shift detector 202 to the edge detect state. In contrast to the illustrated example of FIG. 9, the control logic 201 may change the state of the phase shift detector 202 to the edge detect state in response to a request from the processor 2110 or following a predetermined time after a time at which the state of the phase shift detector 202 changes to the idle state.

At time t72, the negative edge detection signal DTN transitions from low to high. As such, the negative edge count value CNTN may be updated to integer "1". After half the cycle of the internal clock CLKD, the positive edge detection signal DTP transitions from low to high. As such, the positive edge count value CNTP may be updated to integer "2".

Thereafter, consistent with the foregoing, in response to the positive edge detection signal DTP output by the positive edge detector 211 transitioning from high to low, the control logic 201 may change the state of the phase shift detector 202 from the edge detect state to the phase save state. As such, the adder 230 may be again enabled, and the shift value SHFT may be updated. For example, at time t81, as the positive edge detection signal DTP transitions from high to low, the high adder enable signal ENAD may be output from the control logic 201 during one cycle of the internal clock CLKD. In response to the adder enable signal ENAD, the adder 230 may add the positive edge count value CNTP and the negative edge count value CNTN.

After one period of the internal clock CLKD following a time at which the state of the phase shift detector 202 changes to the phase save state, the control logic 201 may again change the state of the phase shift detector 202 to the idle state. For example, at time t82, the adder 230 may output the calculated shift value SHFT to the shift value register 240. The shift value register 240 may output the shift value SHFT to the phase modulator 250. The phase modulator 250 may modulate the clock CLK1 based on the shift value SHFT. In the illustrated embodiment of FIG. 9, the shift value SHFT may correspond to integer "3". The phase modulator 250 may delay a phase of the clock CLK1 as much as 3 periods of the internal clock CLKD and output the delayed clock as the modulated clock CLKM. Thereafter, the state of the phase shift detector 202 may again change to the idle state under the control of the control logic 201.

Figure 10:
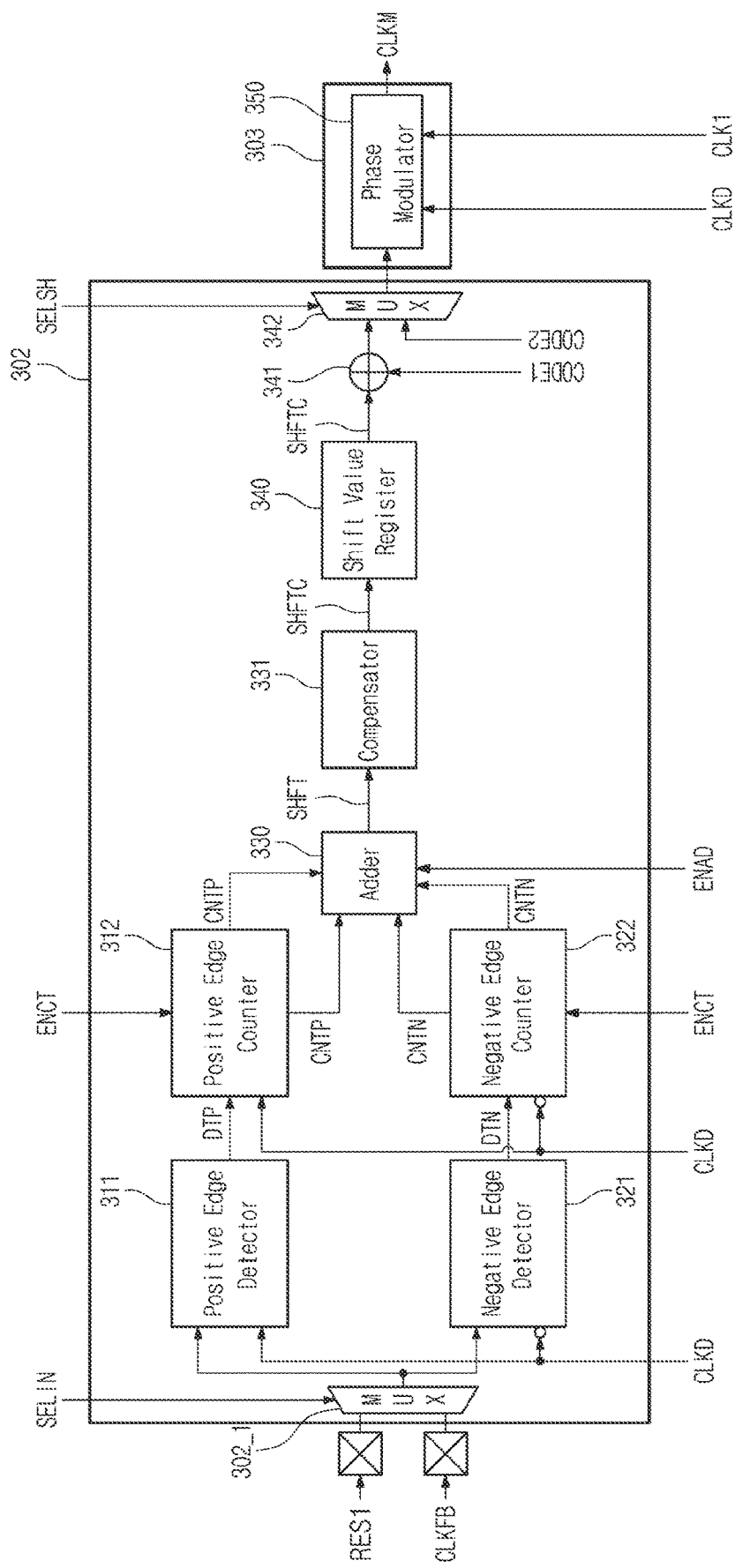
FIG. 10 is a block diagram illustrating a phase shift detector and a phase shifter according to embodiments of the inventive concept.

FIG. 10 is a block diagram illustrating a phase shift detector 302 and a phase shifter 303 according to embodiments of the inventive concept. In some embodiments, the clock modulator 200 of FIG. 6 may include the phase shift detector 302 instead of the phase shift detector 202 and may include the phase shifter 303 instead of the phase shifter 203. Referring to FIGS. 6 and 10, the phase shift detector 302 may include a multiplexer 302_1, a positive edge detector 311, a positive edge counter 312, a negative edge detector 321, a negative edge counter 322, an adder 330, a compensator 331, a shift value register 340, the adder 341, and the multiplexer 342. The phase shifter 303 may include a phase modulator 350. Only material differences between the phase shift detector 202 and the phase shifter 203 of FIG. 7 and the phase shift detector 302 and the phase shifter 303 of FIG. 10 will be described in relation to FIGS. 6, 7, and 10.

The configuration and operation of the multiplexer 302_1, the positive edge detector 311, the positive edge counter 312, the negative edge detector 321, the negative edge counter 322, the adder 330, the shift value register 340, and the phase modulator 350 may be substantially and respectively similar to that of the multiplexer 202_1, the positive edge detector 211, the positive edge counter 212, the negative edge detector 221, the negative edge counter 222, the adder 230, the shift value register 240, and the phase modulator 250 of FIG. 7.

Compared to the phase shift detector 202 of FIG. 7, the phase shift detector 302 of FIG. 10 may further include the compensator 331, the adder 341, and the multiplexer 342. The compensator 331 may perform one or more operations that essentially compensate for fluctuations of the counted value generated by the adder 330 (i.e., the shift value SHFT) over time. For example, the compensator 331 may calculate an average of shift values output from the adder 330 upon receiving the feedback clock CLKFB over a number of periods. That is, in one embodiment, the compensator 331 may calculate an average of shift values output from the adder 330 during receiving the feedback clock CLKFB over 128 periods. The compensator 331 may generate a compensated shift value SHFTC based on the calculated average and may provide the compensated shift value SHFTC to the shift value register 340. Alternately, the compensator 331 may additionally perform other operations associated with compensating for the shift value SHFT.

The adder 341 may receive the compensated shift value SHFTC from the compensator 331 and may receive a code CODE1 from the control logic 201 (or the processor 2110). The code CODE1 may be a code for adjusting the compensated shift value SHFTC. For example, the code CODE1 may be a code that is calculated in a software manner for the purpose of adjusting an offset of the compensated shift value SHFTC. The code CODE1 may be determined (or calculated) by the processor 2110 or may generated by the control logic 201 in response to a request of the processor 2110. The adder 341 may perform addition on the compensated shift value SHFTC and the code CODE1.

The multiplexer 342 may receive an addition result from the adder 341 and a code CODE2 from the control logic 201 (or the processor 2110). The multiplexer 342 may receive a shift value selection signal SELSH from the control logic 201. The shift value selection signal SELSH may be a signal that is generated by the control logic 201 for the purpose of selecting one of the calculation result of the adder 341 and the code CODE2. The code CODE2 may be a code that is used to modulate a phase of the clock CLK instead of the compensated shift value SHFTC. For example, the code CODE2 may be calculated by the processor 2110 in a software manner for the purpose of modulating a phase of the clock CLK such that a valid window of data is adjusted.

The multiplexer 342 may output one of the value calculated by the adder 341 or the code CODE2 to the phase modulator 350 based on the shift value selection signal SELSH. The phase modulator 350 may then delay a phase of the clock CLK1 based on the value output by the multiplexer 342 in relation to the internal clock CLKD.

Figure 11:
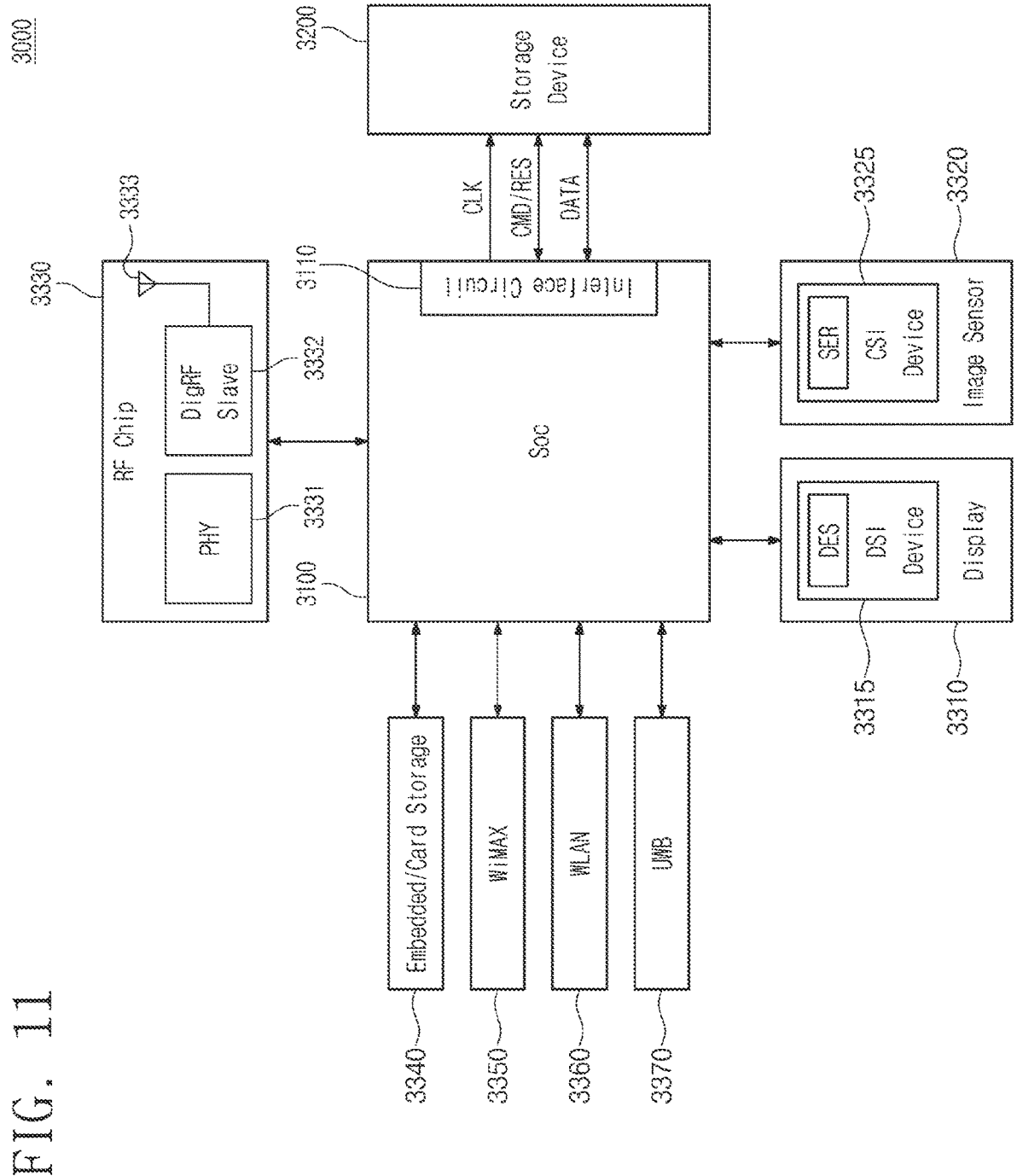
FIG. 11 is a block diagram illustrating an electronic device according to embodiments of the inventive concept.

FIG. 11 is a block diagram illustrating an electronic device 3000 according to embodiments of the inventive concept. The electronic device 3000 may be a data processing device that may use or support interfaces proposed by mobile industry processor interface (MIPI) alliance. The electronic device 3000 may be a portable communication terminal, a personal digital assistant (PDA), a portable multimedia player (PMP), a smartphone, or a wearable device.

The electronic device 3000 may include a system on chip (SoC) 3100 and a device 3200. The SoC 3100 that is an application processor may control overall operations of the electronic device 3000. Various circuits for controlling the electronic device 3000 may be integrated in the SoC 3100. For example, the SoC 3100 may include an interface circuit 3110.

In some embodiments, the interface circuit 3110 and the storage device 3200 may exchange data with each other. The interface circuit 3110 may send the clock CLK, the command CMD, and the data "DATA" to the storage device 3200, and the storage device 3200 may send the response RES and the data "DATA" to the SoC 3100. Operations of the interface circuit 3110 and the storage device 3200 may be similar to those of the host 1100 and the device 1200 of FIG. 1 or may be similar to those of the host 2100 and the device 2200 of FIG. 6.

The electronic device 3000 may include a display 3310 and an image sensor 3320. The SoC 3100 may communicate with a display serial interface (DSI) device 3315 of the display 3310 through the DSI. For example, an optical serializer (SER) may be implemented in the SoC 3100, and an optical deserializer DES may be implemented in the DSI device 3315.

The SoC 3100 may communicate with a camera serial interface (CSI) device 3325 of the image sensor 3320 through the CSI. For example, an optical deserializer (DES) may be implemented in the SoC 3100, and an optical serializer SER may be implemented in the CSI device 3325.

The electronic device 3000 may further include a radio frequency (RF) chip 3330 that communicates with the SoC 3100. The RF chip 3330 may include a physical layer 3331, a DigRF slave 3332, and an antenna 3333. For example, the physical layer 3331 of the RF chip 3330 and a physical layer of the SoC 3100 may exchange data with each other through a DigRF interface proposed by the MIPI alliance.

The electronic device 3000 may further include embedded/card storage 3340. The embedded/card storage 3340 may exchange data with the SoC 3100. In an embodiment, the SoC 3100 may receive data input/output signals and a data strobe signal output from the embedded/card storage 3340, may determine data valid windows of the data input/output signals, and may control read margins of the data input/output signals.

The electronic device 3000 may communicate with an external system through worldwide interoperability for microwave access (WiMAX) 3350, a wireless local area network (WLAN) 3360, ultra-wide band (UWB) 3370, and the like. Also, the electronic device 3000 may further include a global positioning system (GPS) device for processing position information. The electronic device 3000 may further include a bridge chip for managing connection with peripheral devices.

A clock modulator according to embodiments of the inventive concept may modulate a phase of a clock used in a host based on a response received from a device or a feedback clock received from a level shifter. As such, the host may more securely and efficiently perform data processing in a valid window for data received from the device.

While the inventive concept has been described with reference to certain illustrated embodiments, it will be apparent to those of ordinary skill in the art that various changes and modifications may be made thereto without departing from the scope of the inventive concept as set forth in the following claims.

What is claimed is:

1. A host interface in a host for communicating data with an external device, the host interface comprising:
a phase shift detector;
a phase shifter; and
control logic configured to control operation of the phase shift detector and the phase shifter,
wherein the host interface is configured to send a command and a main clock signal to the external device, receive a response from the external device, communicate data to the external device synchronously with the main clock signal, and sample data received from the external device synchronously with a modulated clock signal,
wherein the phase shift detector is configured to provide a shift value based on the response from the external device, and
the phase shifter is configured to modulate a phase of the main clock signal based on the shift value to generate the modulated clock signal,
wherein the control logic is further configured to generate an internal clock signal, and the phase shift detector includes:
a negative edge detector that is configured to detect a transition of the response from high to low based on a negative edge of the internal clock signal and to generate a negative edge detection signal; and
a negative edge counter that is configured to provide a negative edge count value based on the negative edge detection signal.

2. The host interface of claim 1, wherein the phase shift detector is further configured to start a counting operation generating a counted value after a first time passes from a time at which the main clock signal is sent to the external device, and output the counted value as the shift value at a second time at which the response is received from the external device.

3. The host interface of claim 1, wherein the phase shift detector further comprises: includes:
a positive edge detector that is configured to detect the response transitioning from high to low based on a positive edge of the internal clock signal and to generate a positive edge detection signal; and
a positive edge counter that is configured to provide a positive edge count value based on the positive edge of the internal clock signal based on the positive edge detection signal.

4. The host interface of claim 3, wherein the positive edge detector includes:

a first positive edge synchronizer that allows a first-positive synchronizer signal to toggle at a next positive edge of the internal clock signal in response to toggling of the response;

a second positive edge synchronizer that allows a second-positive synchronizer signal to toggle at a next positive edge of the internal clock signal in response to toggling of the first-positive synchronizer signal;

a third positive edge synchronizer that allows a third-positive synchronizer signal to toggle at a next positive edge of the internal clock signal in response to toggling of the second-positive synchronizer signal; and an AND gate that performs a logical AND operation on the third-positive synchronizer signal and an inverted version of the second-positive synchronizer signal to generate the positive edge detection signal.

5. The host interface of claim 3, wherein the negative edge detector includes:

a first negative edge synchronizer that allows a first-negative synchronizer signal to toggle at a next negative edge of the internal clock signal in response to toggling of the response;

a second negative edge synchronizer that allows a second-negative synchronizer signal to toggle at a next negative edge of the internal clock signal in response to toggling of the first-negative synchronizer signal;

a third negative edge synchronizer that allows a third-negative synchronizer signal to toggle at a next negative edge of the internal clock signal in response to toggling of the second-negative synchronizer signal; and an AND gate that performs a logical AND operation on the third-negative synchronizer signal and an inverted version of the second-negative synchronizer signal to generate the negative edge detection signal.

6. The host interface of claim 5, wherein the phase shift detector further includes an adder configured to sum the positive edge count value and the negative edge count value to generate the shift value; and the phase shifter includes a phase modulator that delays the phase of the main clock signal to generate the modulated clock signal based on the shift value, the main clock signal and the internal clock signal.

7. The host interface of claim 6, further comprising:

a shift value register receiving the shift value from the adder, storing the shift value, and providing the shift value to the phase modulator.

8. A system including a host interface disposed in a host for communicating data with an external device through a level shifter, the host interface comprising:

a phase shift detector;

a phase shifter; and control logic configured to control operation of the phase shift detector and the phase shifter, wherein the host interface is configured to send a command and a main clock signal to the external device through the level shifter, receive a response from the external device through the level shifter, and receive a feedback clock signal from the level shifter, wherein the phase shift detector is configured to select one of the response and the feedback clock signal as a selected value in response to receiving an input selection signal, and to provide a shift value based on the selected value, wherein the phase shifter is configured to modulate a phase of the main clock signal based on the shift value to generate a modulated clock signal, wherein the host interface is configured to send data to the external device through the level shifter synchronously with the main clock signal, and wherein the host interface is configured to sample data received from the external device through the level shifter using the modulated clock signal.

9. The host interface of claim 8, wherein the control logic is further configured to generate the input selection signal, and the phase shift detector is further configured to start a counting operation in relation to a first time at which the main clock signal is sent to the external device through the level shifter to generate a counted value as the shift value in response to the selected value.

10. The host interface of claim 8, wherein the control logic is further configured to generate an internal clock signal, and the phase shift detector includes:

a first multiplexer that selects one of the response and the feedback clock signal as the selected value;

a positive edge detector that detects the selected value transitioning from high to low based on a positive edge of the internal clock signal to generates a positive edge detection signal;

a negative edge detector that detects the selected value transitioning from high to low based on a negative edge of the internal clock signal to generate a negative edge detection signal;

a positive edge counter that provides a positive edge count value based on the positive edge of the internal clock signal in response to the positive edge detection signal; and a negative edge counter that provides a negative count value based on the negative edge of the internal clock signal in response to the negative edge detection signal.

11. The host interface of claim 10, wherein the phase shift detector further includes:

a first adder configured to sum the positive edge count value and the negative edge count value to generate a counted value;

a compensator configured to compensate for fluctuation of the counted value over a number of main clock signal periods to generate a compensated shift value; and a shift value register that stores the compensated shift value.

12. The host interface of claim 10, wherein the positive edge detector includes; a first positive edge synchronizer that allows a first-positive synchronizer signal to toggle at a next positive edge of the internal clock signal in response to toggling of the response, a second positive edge synchronizer that allows a second-positive synchronizer signal to toggle at a next positive edge of the internal clock signal in response to toggling of the first-positive synchronizer signal, a third positive edge synchronizer that allows a third-positive synchronizer signal to toggle at a next positive edge of the internal clock signal in response to toggling of the second-positive synchronizer signal, and a positive-logic-operation AND gate that performs a logical AND operation on the third-positive synchronizer signal and an inverted version of the second-positive synchronizer signal to generate the positive edge detection signal, and the negative edge detector includes; a first negative edge synchronizer that allows a first-negative synchronizer signal to toggle at a next negative edge of the internal clock signal in response to toggling of the response, a second negative edge synchronizer that allows a second-negative synchronizer signal to toggle at a next negative edge of the internal clock signal in response to toggling of the first-negative synchronizer signal, a third negative edge synchronizer that allows a third-negative synchronizer signal to toggle at a next negative edge of the internal clock signal in response to toggling of the second-negative synchronizer signal, and a negative-logic-operation AND gate that performs a logical AND operation on the third-negative synchronizer signal and an inverted version of the second-negative synchronizer signal to generate the negative edge detection signal.

13. The host interface of claim 11, wherein the phase shift detector further includes:
    a second adder that generates an addition result based on the compensated shift value and a first code generated by the control logic for adjusting the compensated shift value; and
    a second multiplexer that generates the shift value by selecting between the addition result and a second code in response to a shift value selection signal generated by the control logic.

14. The host interface of claim 11, wherein the control logic is further configured to generate a counter enable signal enabling the positive edge counter and the negative edge counter.

15. The host interface of claim 13, wherein the phase shifter includes a phase modulator that delays the phase of the main clock signal to generate the modulated clock signal based on the shift value, the main clock signal and the internal clock signal.

16. The host interface of claim 15, wherein the phase modulator delays the phase of the main clock signal by an amount corresponding to a product of a period of the internal clock signal and the shift value.

17. A system-on-chip comprising:
    a processor; and
    a host including a host interface with a clock modulator, wherein the host interface is configured to send a command and a main clock signal to an external device through a level shifter and receive a response to the command from the external device through the level shifter under control of the processor,
    the clock modulator is configured to select one of the response and a feedback clock signal received from a level shifter as a selected value, and modulate a phase of the main clock signal based on the selected value to generate a modulated clock signal,
    wherein the host is configured to send data to the external device through the level shifter synchronously with the main clock signal, and
    wherein the host is configured to sample, synchronously with the modulation clock signal, data received from the external device through the level shifter.

18. The system-on-chip of claim 17, wherein upon selection of the response as the selected value by the clock modulator, the clock modulator is further configured to start a counting operation in relation to a first time at which the main clock signal is sent to the external device through the level shifter to generate a counted value based on the response, and
    delay the phase of the main clock signal based on the counted value.

19. The system-on-chip of claim 17, wherein upon selection of the feedback clock signal as the selected value by the clock modulator, the clock modulator is further configured to start a counting operation in relation to a first time at which the main clock signal is sent to the external device through the level shifter to generate a counted value based on the feedback clock signal, and
    delay the phase of the main clock signal based on the counted value.

20. The system-on-chip of claim 17, wherein the clock modulator is further configured to start a counting operation in relation to a time at which the main clock signal is sent to the external device through the level shifter to generate a counted value,
    calculate a shift value from the counted value in response to the selected value, correct the shift value based on a correction code provided by the processor to generate a corrected shift value,
    modulate the phase of the main clock signal based on one of the corrected shift value and a modulation code provided by the processor.

* * * * *